(12) United States Patent
Shini

(10) Patent No.: US 9,825,098 B2
(45) Date of Patent: Nov. 21, 2017

(54) SEMICONDUCTOR MEMORY DEVICE

(71) Applicant: TOSHIBA MEMORY CORPORATION, Minato-ku, Tokyo (JP)

(72) Inventor: Masato Shini, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/074,395

(22) Filed: Mar. 18, 2016

(65) Prior Publication Data

US 2017/0256586 A1   Sep. 7, 2017

Related U.S. Application Data

(60) Provisional application No. 62/303,505, filed on Mar. 4, 2016.

(51) Int. Cl.
*H01L 21/00*   (2006.01)
*H01L 27/24*   (2006.01)
*H01L 45/00*   (2006.01)

(52) U.S. Cl.
CPC ...... *H01L 27/2463* (2013.01); *H01L 45/1233* (2013.01); *H01L 45/1253* (2013.01); *H01L 45/146* (2013.01)

(58) Field of Classification Search
CPC ............ H01L 27/2463; H01L 45/1233; H01L 45/1253
See application file for complete search history.

(56) References Cited

U.S. PATENT DOCUMENTS

| | | | |
|---|---|---|---|
| 2012/0217461 A1* | 8/2012 | Kobayashi | H01L 45/08 257/2 |
| 2013/0229846 A1 | 9/2013 | Chien et al. | |
| 2014/0061574 A1 | 3/2014 | Pio | |
| 2015/0221368 A1* | 8/2015 | Kanno | G11C 13/0069 365/148 |

* cited by examiner

*Primary Examiner* — Laura Menz
(74) *Attorney, Agent, or Firm* — Foley & Lardner LLP

(57) ABSTRACT

A semiconductor memory device according to an embodiment comprises: a first wiring line extending in a first direction; a second wiring line extending in a second direction, the second direction intersecting the first direction; and a memory cell disposed at an intersection of the first wiring line and the second wiring line, the memory cell including a first film whose resistance changes electrically, a second film having conductivity, and a third film having an insulating property which are stacked sequentially in a third direction that intersects the first and second directions.

14 Claims, 7 Drawing Sheets

SEMICONDUCTOR MEMORY DEVICE

CROSS-REFERENCE TO RELATED APPLICATIONS

This application is based upon and claims the benefit of priority from the prior U.S. Provisional Application 62/303,505, filed on Mar. 4, 2016, the entire contents of which are incorporated herein by reference.

BACKGROUND

Field

An embodiment of the present invention relates to a semiconductor memory device.

Description of the Related Art

A flash memory is a semiconductor memory device known for its low cost and large capacity. One example of a semiconductor memory device to replace the flash memory is a variable resistance type memory (ReRAM: Resistance RAM) which employs a variable resistance film in its memory cell. The ReRAM can configure a cross-point type memory cell array, hence can achieve an increased capacity similarly to the flash memory. Moreover, in order to further increase capacity, there is also being developed a ReRAM having a so-called VBL (Vertical Bit Line) structure in which bit lines which are selection wiring lines are arranged in a perpendicular direction to a semiconductor substrate.

DETAILED DESCRIPTION

A semiconductor memory device according to an embodiment comprises: a first wiring line extending in a first direction; a second wiring line extending in a second direction, the second direction intersecting the first direction; and a memory cell disposed at an intersection of the first wiring line and the second wiring line, the memory cell including a first film whose resistance changes electrically, a second film having conductivity, and a third film having an insulating property which are stacked sequentially in a third direction that intersects the first and second directions.

A semiconductor memory device according to an embodiment will be described below with reference to the drawings.

First, an overall configuration of the semiconductor memory device according to the embodiment will be described.

Figure 1:
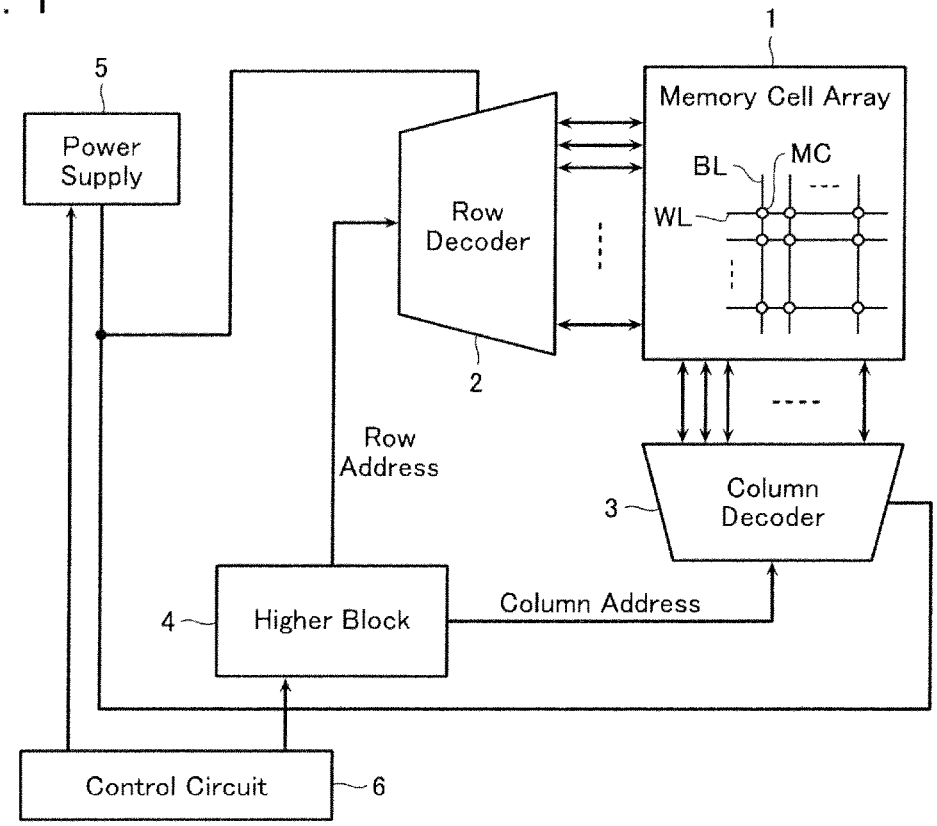
FIG. 1 is a view showing functional blocks of a semiconductor memory device according to an embodiment.

FIG. 1 is a view showing functional blocks of the semiconductor memory device according to the embodiment.

As shown in FIG. 1, the semiconductor memory device of the embodiment comprises: a memory cell array 1; a row decoder 2; a column decoder 3; a higher block 4; a power supply 5; and a control circuit 6.

The memory cell array 1 includes: a plurality of word lines WL and a plurality of bit lines BL; and a plurality of memory cells MC selected by these word lines WL and bit lines BL. The row decoder 2 selects the word line WL during an access operation. The column decoder 3 selects the bit line BL during an access operation, and includes a driver that controls the access operation. The higher block 4 selects the memory cell MC which is to be an access target in the memory cell array 1. The higher block 4 provides a row address and a column address to, respectively, the row decoder 2 and the column decoder 3. The power supply 5, during write/read of data, generates certain combinations of voltages corresponding to respective operations, and supplies these combinations of voltages to the row decoder 2 and the column decoder 3. The control circuit 6 performs control of the likes of sending the addresses to the higher block 4, and, moreover, performs control of the power supply 5, based on a command from external.

Next, an outline of the memory cell array 1 will be described.

Figure 2:
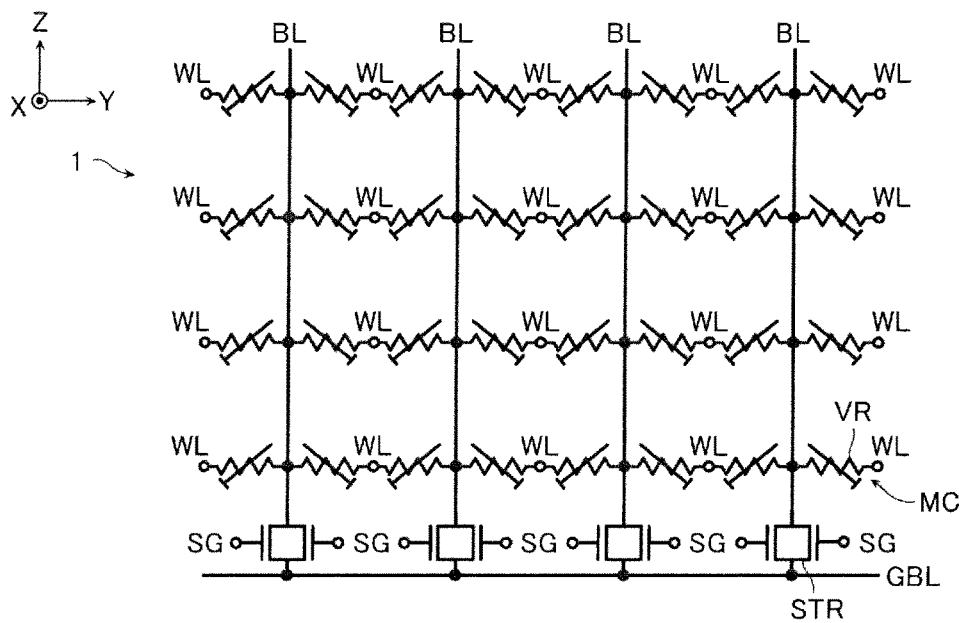
FIG. 2 is a circuit diagram of a memory cell array of the semiconductor memory device according to the embodiment.

FIG. 2 is a circuit diagram of the memory cell array of the semiconductor memory device according to the embodiment.

As shown in FIG. 2, the memory cell array 1 includes: the plurality of word lines WL extending in an X direction; the plurality of bit lines BL extending in a Z direction; and the plurality of memory cells MC disposed at intersections of the plurality of word lines WL and the plurality of bit lines BL. In addition, the memory cell array 1 includes a plurality of global bit lines GBL. The bit lines BL arranged in a Y direction, of the plurality of bit lines BL, are commonly connected to one of the global bit lines GBL via a select transistor STR. Each of the select transistors STR is controlled by a select gate line SG.

Next, a structure of the memory cell array 1 will be described.

Figure 3:
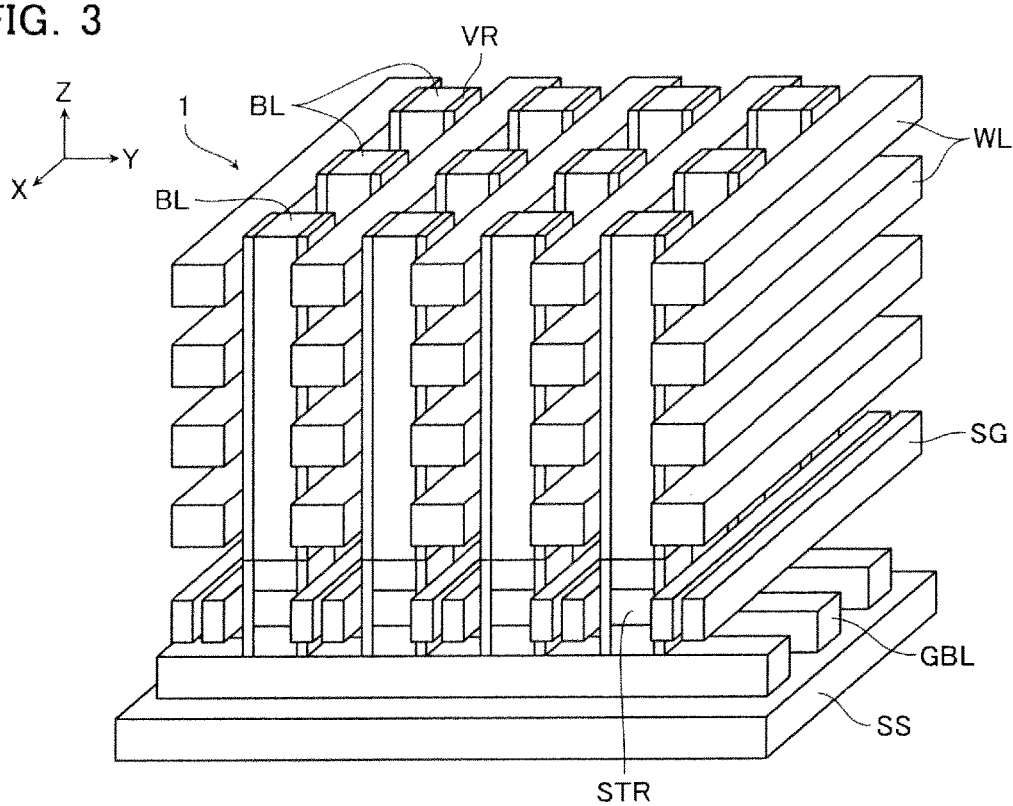
FIG. 3 is a schematic perspective view of the memory cell array of the semiconductor memory device according to the embodiment.
Figure 4:
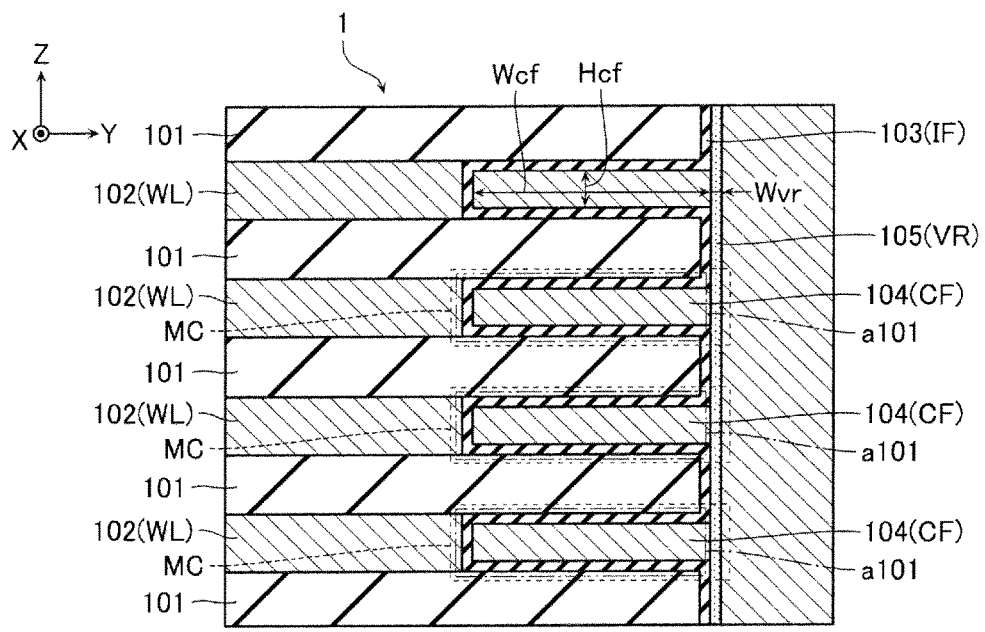
FIG. 4 is a cross-sectional view of a memory cell periphery of the memory cell array of the semiconductor memory device according to the embodiment.

FIG. 3 is a perspective view of the memory cell array of the semiconductor memory device according to the embodiment. FIG. 3 is a structure omitting part of a configuration of the memory cell MC or an inter-layer insulating film between wiring lines, and so on. In addition, FIG. 4 is a cross-sectional view in the Y-Z directions of a memory cell periphery of the memory cell array of the same semiconductor memory device.

As shown in FIG. 3, the memory cell array 1 has a so-called VBL (Vertical Bit Line) structure in which the bit line BL extends perpendicularly to a principal plane of a semiconductor substrate SS. In other words, the plurality of word lines WL are arranged in a matrix in the Y direction and the Z direction, and each extend in the X direction. The plurality of bit lines BL are arranged in a matrix in the X direction and the Y direction, and extend in the Z direction. Moreover, each of the memory cells MC is disposed at each of the intersections of these plurality of word lines WL and plurality of bit lines BL. In other words, the plurality of memory cells MC are arranged in a three-dimensional matrix in the X direction, the Y direction, and the Z direction. Now, the word line WL is formed by titanium nitride (TiN) or tungsten (W), for example. The bit line BL is formed by polysilicon (Poly-Si), for example.

The plurality of global bit lines GBL are disposed between the semiconductor substrate SS and the plurality of bit lines BL. The plurality of global bit lines GBL are arranged in the X direction and extend in the Y direction. Note that the global bit line GBL need not be disposed directly above the semiconductor substrate SS, and there may be the likes of another element disposed between the global bit line GBL and the semiconductor substrate SS. For example, it is also possible for a circuit due to a CMOS element to be formed on the semiconductor substrate SS and for the global bit line GEL to be disposed on that circuit. In addition, the select transistor STR is disposed at each of lower ends of the plurality of bit lines BL. Note that the select transistor STR need not be disposed below the bit line BL and may be disposed upwardly of the word line WL or the bit line BL. These select transistors STR are controlled by a plurality of the select gate lines SG arranged in the Y direction and extending in the X direction. In the case of FIG. 3, a plurality of the select transistors STR arranged in the X direction are controlled by one select gate line SG, while the select transistors STR arranged in the Y direction are controlled separately.

Note that hereafter, the semiconductor memory device comprising the memory cell array 1 of VBL structure shown in FIG. 3 will be described as an example. However, it should be noted that the present embodiment can be widely applied to a semiconductor memory device employing a memory cell MC having a variable resistance film, such as the case where the memory cells MC are disposed in a two-dimensional matrix extending in the X direction and the Y direction.

As shown in FIG. 4, the memory cell MC includes a variable resistance film VR, a conductive film CF, and an insulating film IF arranged sequentially in the Y direction. Now, the variable resistance film VR is formed by a material whose resistance changes electrically, and is formed by hafnium oxide ($HfO_2$), for example. The conductive film CF is formed by a metal such as titanium nitride (TiN) or tungsten (W), for example. The insulating film IF is a film that provides nonlinear current-voltage characteristics (hereafter, called "I-V characteristics") to the memory cell MC, and is formed by silicon oxide ($SiO_2$), for example.

The memory cell array 1 comprises an inter-layer insulating film 101 disposed between each of the word lines WL, in addition to the configuration shown in FIG. 3. Moreover, side surfaces facing the bit line BL of each of the word lines WL are more distantly separated from the bit line BL in the Y direction than a side surface facing the bit line BL of the inter-layer insulating film 101 is (places a101 shown in FIG. 4). The conductive film CF and the insulating film IF of the memory cell MC are disposed in this place a101.

The variable resistance films VR of two of the memory cells MC adjacent in the Z direction are formed integrally along a side surface facing the Y direction of the bit line BL.

The conductive films CF of two of the memory cells MC adjacent in the Z direction are separated between these two memory cells MC. Side surfaces facing the Y direction of each of the conductive films CF contact the variable resistance film VR at the same position in the Z direction as the word line WL.

The insulating films IF of two of the memory cells MC adjacent in the Z direction are formed integrally. This insulating film IF is disposed between a certain word line WL and the two of the inter-layer insulating films 101 sandwiching in the Z direction said certain word line WL, and the conductive film CF, at the place a101. In addition, this insulating film IF is disposed so as to contact a side surface facing the Y direction and upper surface of one of said two inter-layer insulating films 101, a side surface facing the Y direction of said certain word line WL, and a bottom surface and side surface facing the Y direction of the other of said two inter-layer insulating films 101. Moreover, a side surface facing the Y direction of the insulating film IF is disposed in an identical plane to a side surface facing the Y direction of the conductive film CF. Furthermore, the side surface facing the Y direction of the insulating film IF contacts the variable resistance film VR at the same position in the Z direction as the inter-layer insulating film 101. Note that the insulating film IF need not necessarily be integrated between the memory cells MC adjacent in the Z direction, and may be separated between these memory cells.

Next, advantages of the memory cell MC having the above-described structure will be described.

Figure 5:
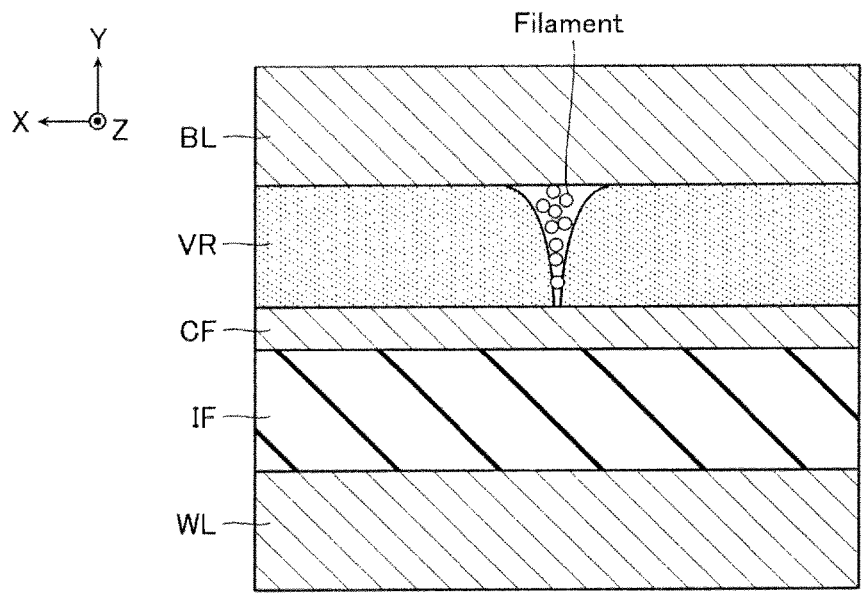
FIG. 5 is a cross-sectional view explaining advantages of a conductive film of a memory cell of the semiconductor memory device according to the embodiment.
Figure 6:
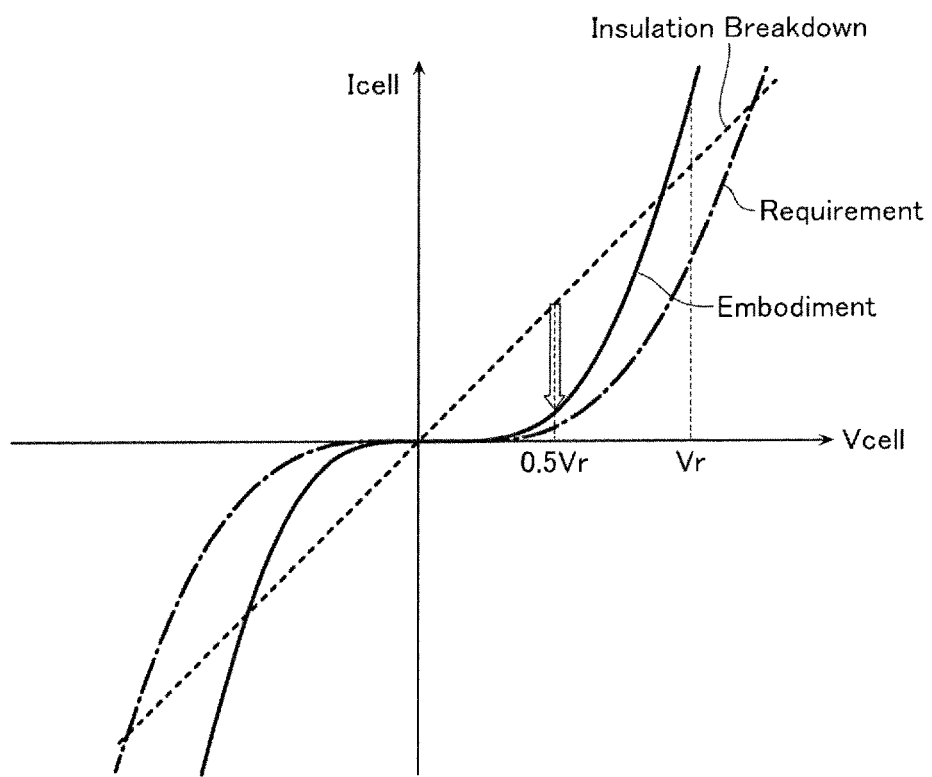
FIG. 6 is a graph showing current-voltage characteristics of the memory cell of the semiconductor memory device according to the embodiment.

FIG. 5 is a cross-sectional view explaining advantages of the conductive film of the memory cell of the semiconductor memory device according to the embodiment. In addition, FIG. 6 is a graph showing I-V characteristics of the memory cell of the same semiconductor memory device.

An access operation on the memory cell MC, in addition to including a write operation causing transition of a resistance state of the variable resistance film VR, includes also a read operation and a forming operation.

The read operation on the memory cell MC is an operation that detects the resistance state of the variable resistance film VR, and is achieved by, for example, applying a certain read voltage Vcell=Vr to a selected memory cell MC and detecting a cell current Icell flowing in the selected memory cell MC at this time. At this time, an unselected memory cell MC is applied with a voltage of Vcell=Vr/2 or less, for example, so as to prevent a large cell current Icell from flowing in the unselected memory cell MC. Required in order to achieve such a read operation with low power consumption are nonlinear I-V characteristics where, as shown by the dot-chain line of FIG. 6, for example, a cell current Icell sufficient for detection of data is passed through the memory cell MC when selected (in other words, when the read voltage Vcell=Vr has been applied), and only a cell current Icell as minute as possible flows in the memory cell MC when unselected (in other words, when the voltage of Vcell=Vr/2 or less has been applied).

The forming operation on the memory cell MC is an operation performed immediately after manufacturing of the memory cell MC and is an operation that forms a filament path in the variable resistance film VR. This makes it possible for transition of the resistance state of the variable resistance film VR to be stably performed. This forming operation is achieved by applying the memory cell MC with a forming voltage higher than a write voltage employed in the write operation.

Now, in this forming operation, the following point must be taken into consideration. In other words, during the forming operation, although the memory cell MC is applied with the forming voltage, once the filament path has been formed in the variable resistance film VR, a greater part of the forming voltage ends up being applied to a portion excluding the variable resistance film VR of the memory cell MC. Now, supposing the memory cell MC does not have the conductive film CF, then, as a result, this voltage is applied directly to the insulating film IF, and in the worst case, insulation breakdown of the insulating film IF ends up occurring. As a result, nonlinearity of the I-V characteristics of the memory cell MC which had been guaranteed by the insulating film IF ends up showing linearity as shown by the dotted line of FIG. 6, and the cell current Icell flowing in the unselected memory cell MC during the read operation ends up increasing.

In this respect, the memory cell MC of the embodiment includes the conductive film CF between the variable resistance film VR and the insulating film IF. Moreover, due to a resistance component included in this conductive film CF, an increase in the voltage applied to the insulating film IF during filament path formation can be relieved. As a result, it becomes more difficult for insulation breakdown of the insulating film IF to occur, and as shown by the solid line of FIG. 6, it becomes easier for nonlinearity of the I-V characteristics of the memory cell MC to be maintained. As a result, of course, the cell current Icell flowing in the unselected memory cell MC during the read operation is significantly reduced compared to the case where the insulating film IF has undergone insulation breakdown (outline arrow of FIG. 6).

Note that in order for the above-described relief advantage during the forming operation to be more greatly obtained, it is desirable that the conductive film CF is provided with a certain degree of thickness with respect to a current path (in the case of FIG. 4, the Y direction). For example, it is desirable that as shown in FIG. 4, a thickness Wcf in the Y direction of the conductive film CF is configured larger than a thickness Hcf in the Z direction (or an unillustrated thickness in the X direction) of the conductive film CF and is configured larger than a thickness Wvr in the Y direction of the variable resistance film VR.

Next, manufacturing steps of the memory cell array 1 will be described.

FIGS. 7 to 13 are cross-sectional views in the Y-Z directions describing the manufacturing steps of the memory cell array of the semiconductor memory device according to the present embodiment.

Figure 7:
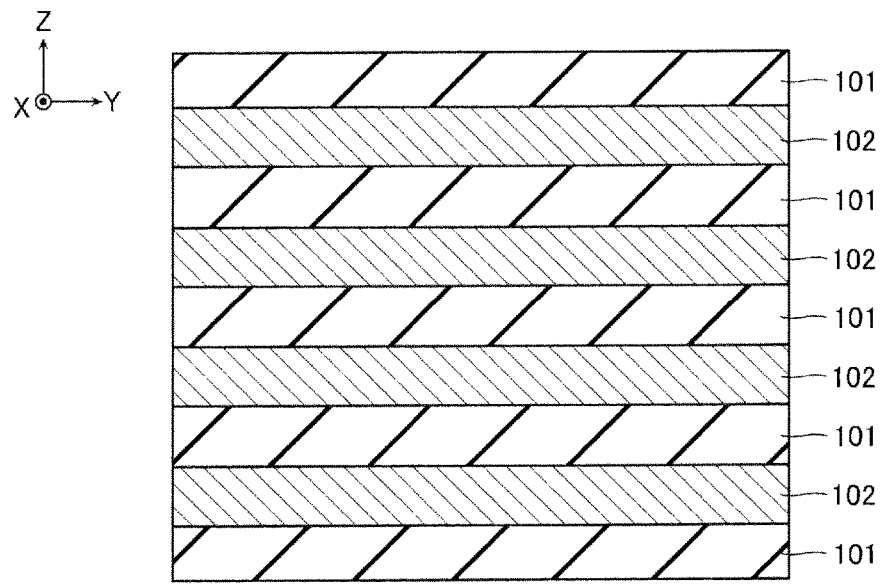
FIGS. 7 to 13 are cross-sectional views describing manufacturing steps of the memory cell array of the semiconductor memory device according to the embodiment.

First, as shown in FIG. 7, a plurality of inter-layer insulating films 101 and conductive films 102 are stacked alternately on an unillustrated semiconductor substrate. Now, the inter-layer insulating film 101 is formed by silicon oxide (SiO$_2$), for example. The conductive film 102 is formed by titanium nitride (TiN) or tungsten (W), for example, and functions as the word line WL.

Figure 8:
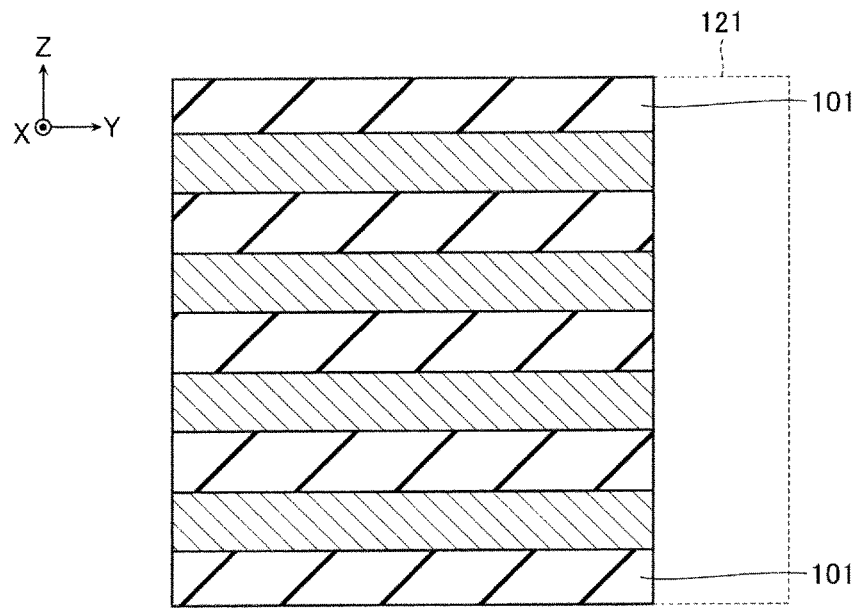

Next, as shown in FIG. 8, a trench 121 extending in the X direction is formed at least from an upper surface of the uppermost layer inter-layer insulating film 101 to a bottom surface of the lowermost layer inter-layer insulating film 101, by anisotropic etching.

Figure 9:
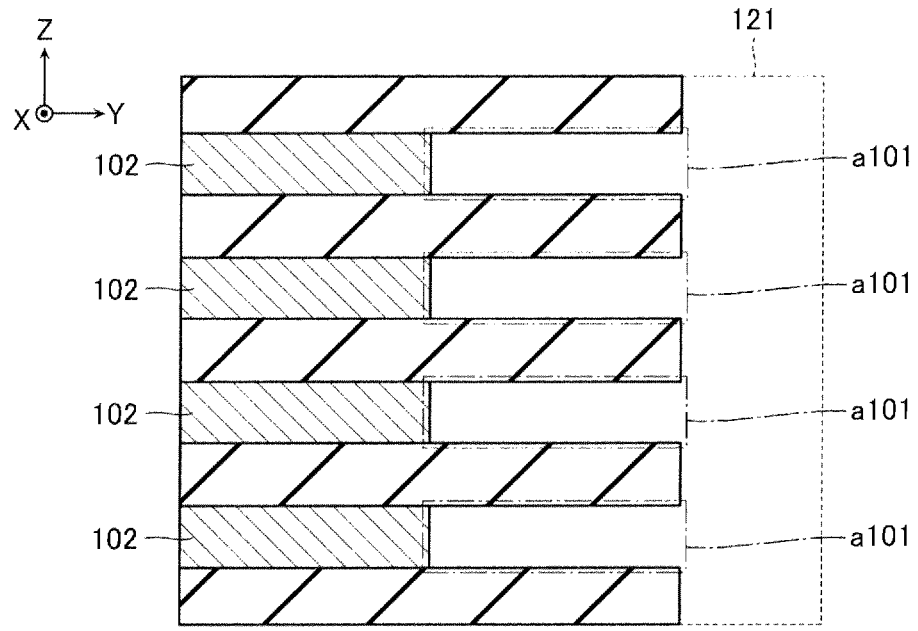

Next, as shown in FIG. 9, an end of the conductive film 102 exposed in the trench 121 is recessed by isotropic etching via the trench 121 (place a101).

Figure 10:
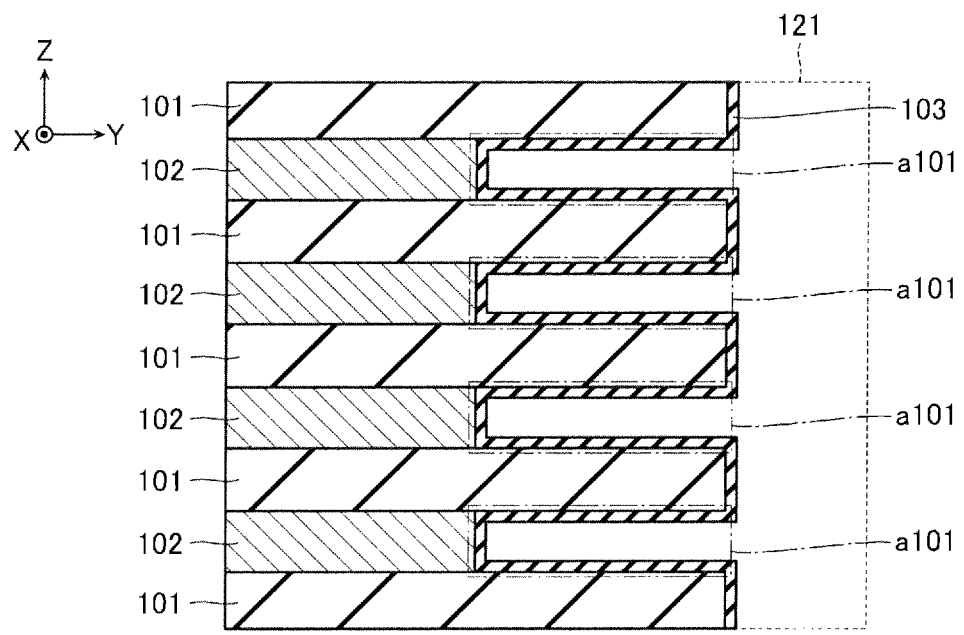

Next, as shown in FIG. 10, an insulating film 103 is deposited on a side surface of the trench 121. As a result, the insulating film 103 contacts the following surfaces exposed in the trench 121 at the place a101, namely, a side surface facing the Y direction and upper surface of the inter-layer insulating film 101 disposed on a lower side of a certain conductive film 102, a side surface facing the Y direction of the certain conductive film 102, and a bottom surface and side surface facing the Y direction of the inter-layer insulating film 101 disposed on an upper side of the certain conductive film 102. Now, the insulating film 103 is formed by silicon oxide (SiO$_2$), for example, and functions as the insulating film IF.

Figure 11:
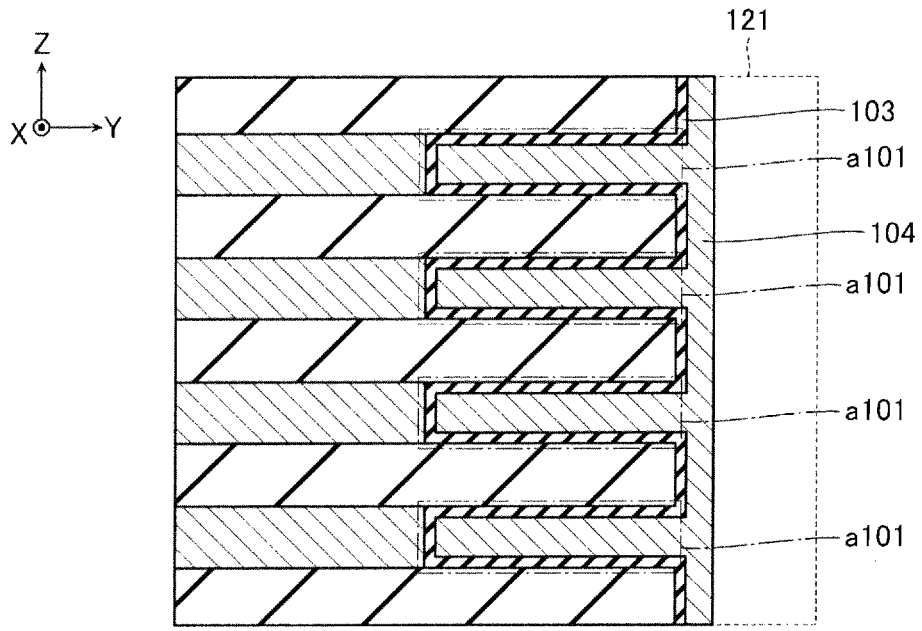

Next, as shown in FIG. 11, a conductive film 104 is deposited in the trench 121 where the insulating film 103 has been deposited, and the conductive film 104 is implanted in the place a101. Now, the conductive film 104 is formed by a metal such as titanium nitride (TiN) or tungsten (W), for example, and functions as the conductive film CF.

Figure 12:
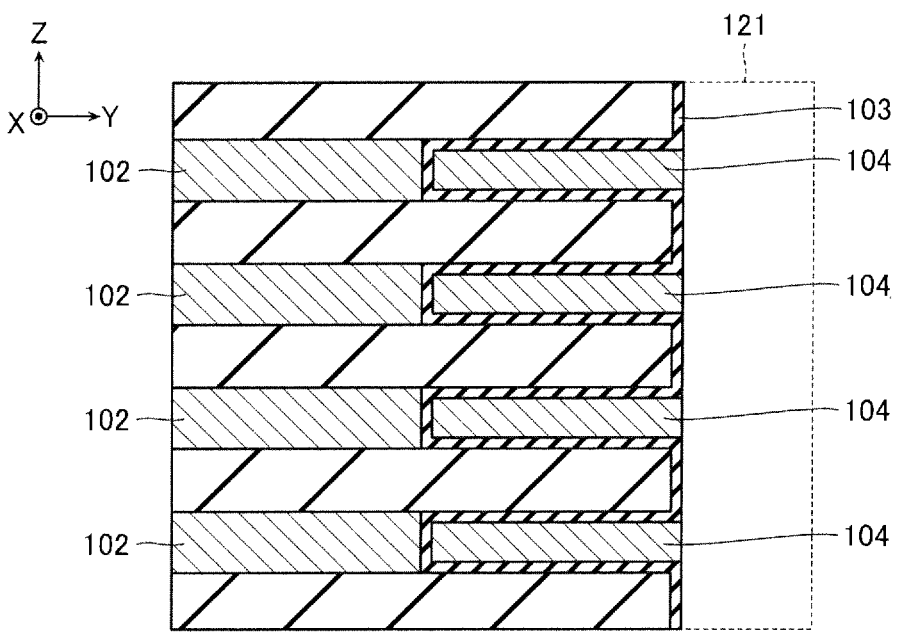

Next, as shown in FIG. 12, the conductive film 104 is removed, by anisotropic etching via the trench 121, until a side surface facing the Y direction of the insulating film 103 is exposed, such that the conductive film 104 is separated at the same position as the inter-layer insulating film 102 in the Z direction.

Figure 13:
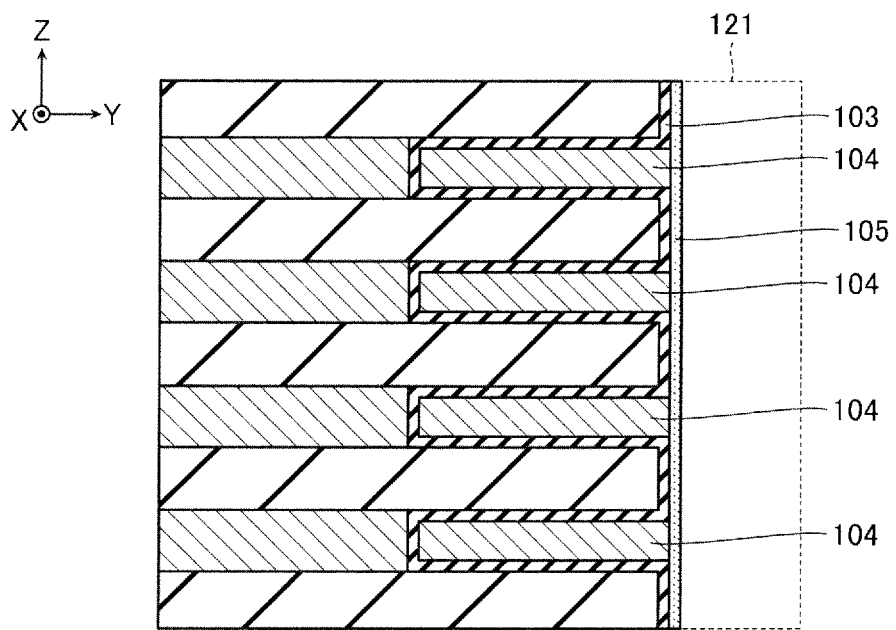

Next, as shown in FIG. 13, a variable resistance film 105 is deposited on a side surface of the trench 121 where the insulating film 103 and the conductive film 104 have been deposited. Now, the variable resistance film 105 is formed by a material whose resistance changes electrically, and is formed by hafnium oxide (HfO$_2$), for example. This variable resistance film 105 functions as the variable resistance film VR.

Finally, a conductive film 106 is deposited in the trench 121 where the variable resistance film 105 has been deposited. This conductive film 106 is formed by polysilicon (Poly-Si), for example, and functions as the bit line BL.

As a result of the manufacturing steps thus far, the memory cell array 1 shown in FIG. 4 is formed.

As is clear from the above, the embodiment makes it possible to provide a semiconductor memory device in which insulation breakdown of an insulating film of a memory cell occurring during a forming operation has been reduced.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
when three directions crossing each other are set to first, second, and third, directions, respectively,
a plurality of first wiring lines which are arranged in the third direction, and which extend in the first direction;
a second wiring line extending in the third direction;
a plurality of memory cells disposed at intersections of the plurality of first wiring lines and the second wiring line; and
a first insulating film disposed between two of the first wiring lines adjacent in the third direction,
one of the memory cells including a first film whose resistance changes electrically, a second film having conductivity, and a third film having an insulating property which are stacked sequentially in the second direction, and
the two first wiring lines being more distantly separated from the second wiring line in the second direction than the first insulating film.

2. The semiconductor memory device according to claim 1, wherein a thickness in the second direction of the second film is larger than a thickness in at least one of the first direction and the third direction of the second film.

3. The semiconductor memory device according to claim 1, wherein a thickness in the second direction of the second film is larger than a thickness in the second direction of the first film.

4. The semiconductor memory device according to claim 1, wherein the first film includes hafnium oxide ($HfO_2$).

5. The semiconductor memory device according to claim 1, wherein the second film includes a metal.

6. The semiconductor memory device according to claim 1, wherein the third film includes silicon oxide ($SiO_2$).

7. The semiconductor memory device according to claim 1, wherein the first film has a filament.

8. The semiconductor memory device according to claim 1, wherein the first films of two of the memory cells adjacent in the third direction are integrated.

9. The semiconductor memory device according to claim 1, wherein the second films of two of the memory cells adjacent in the third direction are separated between the two memory cells.

10. The semiconductor memory device according to claim 1, wherein the third films of two of the memory cells adjacent in the third direction are integrated.

11. The semiconductor memory device according to claim 1, further comprising
two of first insulating films sandwiching one of the first wiring lines in the third direction,
wherein the third film contacts a side surface facing the second direction and upper surface of one of the two first insulating films, a side surface facing the second direction of the first wiring line, and a bottom surface and side surface facing the second direction of the other of the two first insulating films.

12. The semiconductor memory device according to claim 1, wherein a side surface facing the second direction of the second film and a side surface facing the second direction of the third film are disposed in an identical plane.

13. The semiconductor memory device according to claim 1,
wherein the first film contacts the third film at the same position in the third direction as the first insulating film.

14. The semiconductor memory device according to claim 1, further comprising
a semiconductor substrate which extends in the first direction and the second direction.

* * * * *